(12) United States Patent
Smetana

(10) Patent No.: US 6,300,802 B1
(45) Date of Patent: Oct. 9, 2001

(54) OUTPUT BUFFER WITH PROGRAMMABLE VOLTAGE SWING

(75) Inventor: Kenneth Smetana, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 09/253,621

(22) Filed: Feb. 19, 1999

(51) Int. Cl.[7] ............................................. H03K 19/086

(52) U.S. Cl. ................................ 326/126; 326/68; 326/78

(58) Field of Search ............................... 326/126, 83, 86, 326/73, 74; 327/540, 525

(56) References Cited

U.S. PATENT DOCUMENTS

| | | | |
|---|---|---|---|
| 3,760,200 | * 9/1973 | Taniguchi et al. | 307/303 |
| 3,909,636 | 9/1975 | Masaki et al. | 307/303 |
| 4,675,555 | 6/1987 | Okajima et al. | 307/455 |
| 4,945,263 | 7/1990 | Estrada | 307/475 |
| 4,988,899 | 1/1991 | Jansson | 307/475 |
| 5,041,747 | * 8/1991 | Chengson et al. | 307/591 |
| 5,072,136 | 12/1991 | Naghshineh | 307/455 |
| 5,302,892 | * 4/1994 | Tada et al. | 324/158 R |
| 5,304,856 | 4/1994 | Rainal | 307/270 |
| 5,323,068 | 6/1994 | Freitas | 307/455 |
| 5,510,729 | 4/1996 | Reymond | 326/33 |
| 5,552,724 | * 9/1996 | Scott | 326/126 |
| 5,656,952 | 8/1997 | McCall et al. | 326/82 |
| 5,826,182 | * 10/1998 | Gilber | 455/326 |

* cited by examiner

Primary Examiner—Michael Tokar
Assistant Examiner—Anh Tran
(74) Attorney, Agent, or Firm—Gray Cary Ware & Freidenrich

(57) ABSTRACT

An integrated circuit device in which the magnitude of the output voltage swings of outputs in a circuit having emitter coupled output transistors is programmable includes a variable bias generator that produces a bias voltage. The bias voltage is connected to the base of a current source transistor in order to program the magnitude of the output voltage swings. An electrical connection area of the integrated circuit device is connected to the bias voltage generator. An external programming circuit can be connected to the electrical connection area in order to set the bias voltage, to thereby program the desired magnitude of the output voltage swings. The external programming circuit typically can be a resistance or an external voltage source. The variable bias generator can be any of a number of circuits that produce a bias voltage that is dependent upon the external programming circuit connected to the electrical connection area, and that produce a default bias voltage if no external programming circuit is connected to the electrical connection area. Another aspect of the invention is a method for programming the magnitude of the output voltage swings in an integrated circuit device having emitter coupled output transistors. The invention provides the ability to program the magnitude of the output voltage swings of the outputs to increase the magnitude of the output voltage swings, or alternatively, to decrease the magnitude of the output voltage swings thereby advantageously saving power and preventing unnecessary heat generation.

35 Claims, 4 Drawing Sheets

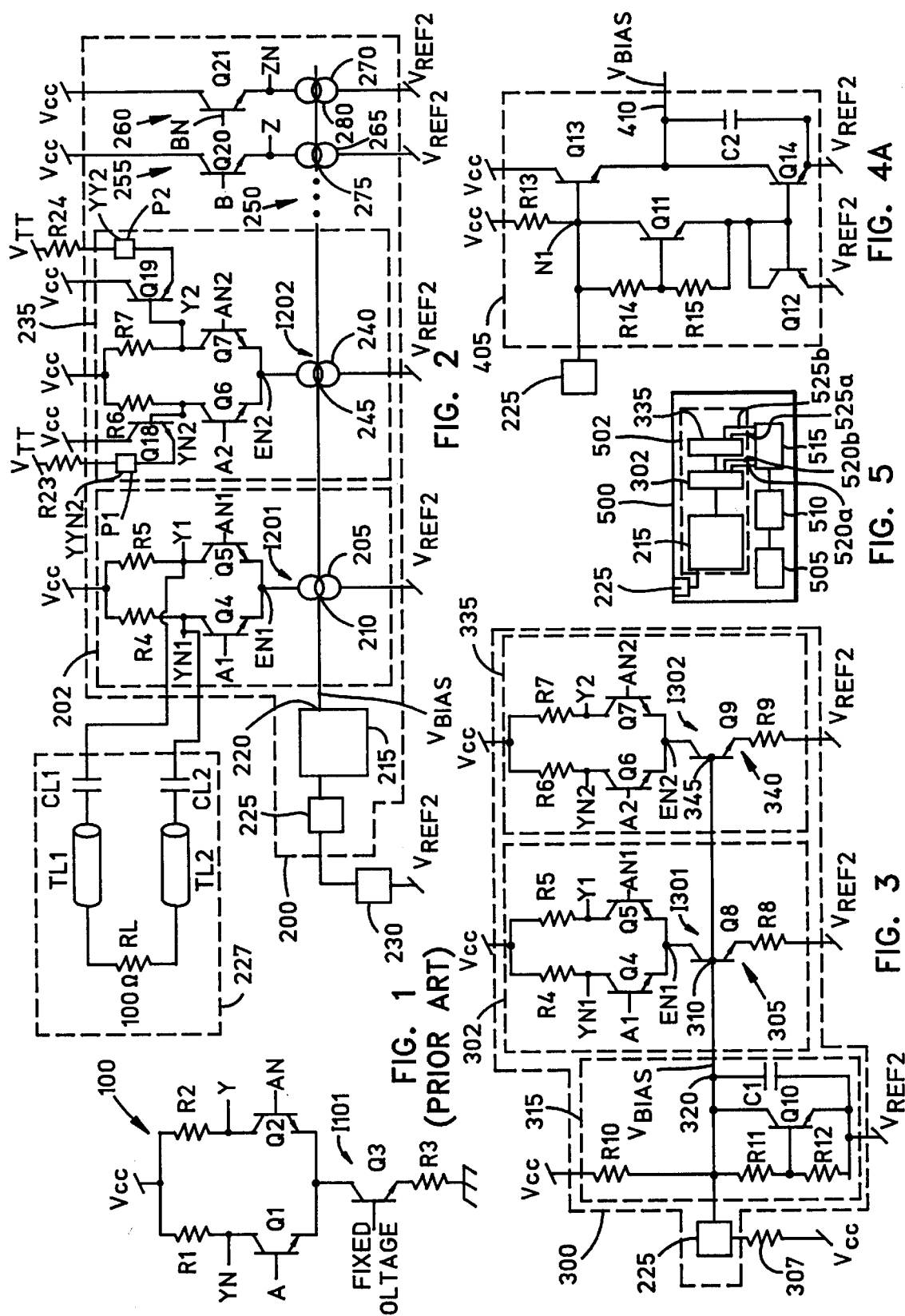

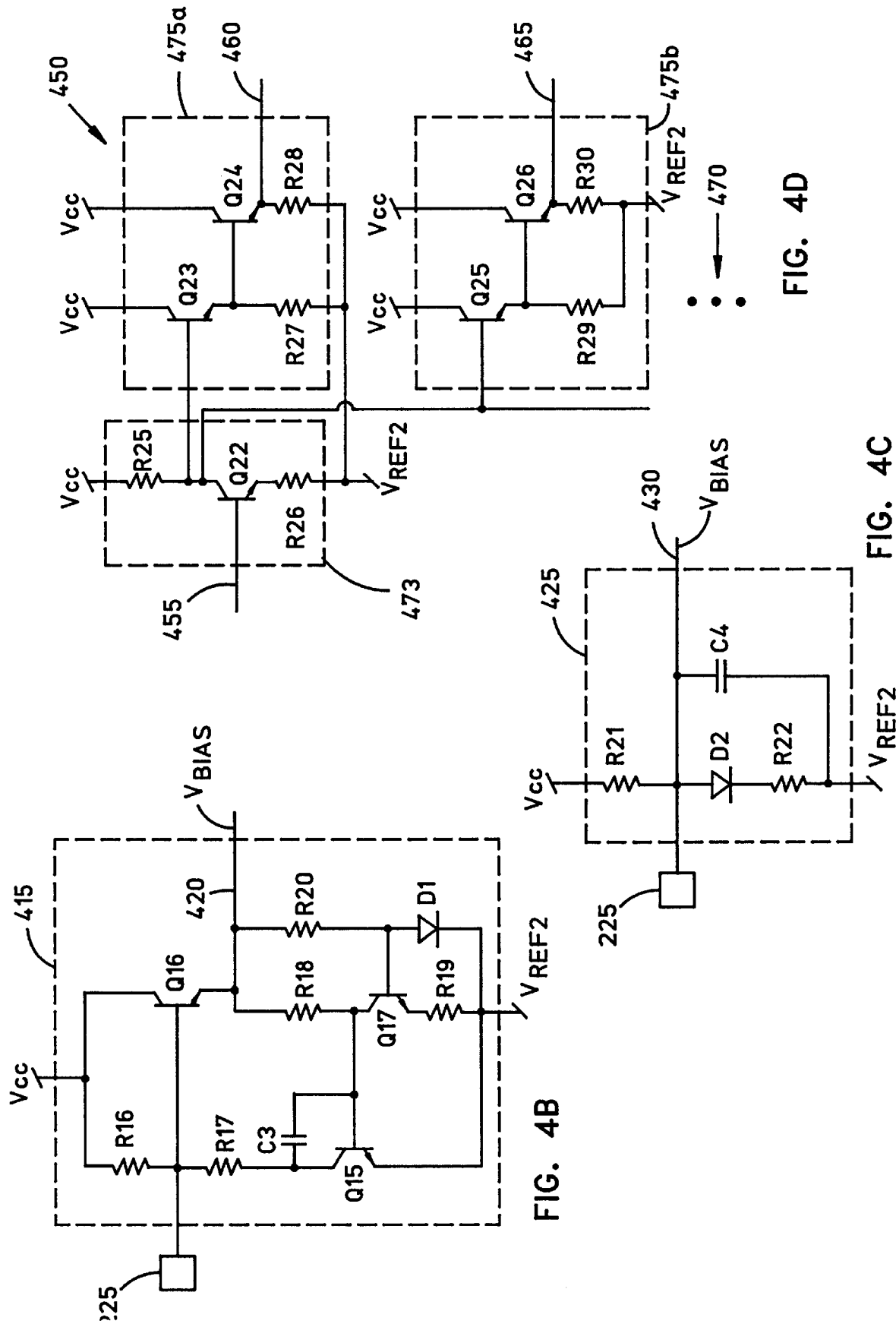

OUTPUT BUFFER WITH PROGRAMMABLE VOLTAGE SWING

CROSS REFERENCE TO RELATED APPLICATION

This application contains subject matter related to the following co-pending U.S. Patent Application, which is incorporated by reference herein: U.S. patent application Ser. No. 09/282883, filed Mar. 31, 199, titled "Emitter Follower Output with Programmable Current", of Kenneth Smetana (the same inventor as the instant application), which is assigned to the same assignee as the instant application.

BACKGROUND OF THE INVENTION

1. Field of the Invention

The invention relates to emitter coupled output circuits. More particularly, the invention concerns an integrated circuit having a pair of emitter coupled output transistors and an electrical connection area that is connectable to an external circuit to program the magnitude of the voltage swings of the outputs.

2. Description of the Related Art

Output buffers are common components of high speed logic circuits. FIG. 1 illustrates a typical prior art current mode logic (CML) output buffer circuit 100 that has emitter coupled outputs. In the buffer circuit 100, the emitters of output transistors Q1 and Q2 are connected together, and are thus "emitter coupled." Resistor R1 is connected to the collector of transistor Q1, and resistor R2 is connected to the collector of transistor Q2. The collector of output transistor Q2 is connected to output Y, and the collector of output transistor Q1 is connected to complementary output YN. The output current I101 for these emitter coupled outputs is set by a constant current source consisting of transistor Q3 and resistor R3. The amount of current through the constant current source determines the magnitudes of the voltage swings of the outputs Y and YN.

Once an integrated circuit that includes a circuit such as circuit 100 is fabricated, the current I101 through the constant current source becomes substantially fixed. Additionally, the voltage swings of the outputs are fixed. Generally, the voltage swings of the outputs will be substantially equal. In circuits such as circuit 100, the bias voltage applied to the base of the current source transistor Q3 is substantially fixed, although some sort of temperature compensation may be included. This bias voltage sets the amount of current through the current source, and the resulting voltage swings of the outputs, at fixed values.

The fixed magnitude of the voltage swings of the outputs in emitter coupled outputs, such as the outputs of the circuit 100 in FIG. 1, is typically set large enough to ensure satisfactory performance for a wide range of applications under worse case conditions, also taking into account imprecision in the magnitude of the voltage swings that may result due to limitations of the manufacturing process. Even though the magnitude of the output voltage swings is set large enough for most applications, some applications may require larger output current swings than is provided.

A significant shortcoming of prior art emitter coupled output circuits such as circuit 100 is that many applications do not require output voltage swings that are as large as the fixed output voltage swings provided, resulting in unnecessary power consumption and heat generation. For very fast and low jitter applications, the collector resistors that determine the output voltage swings must be set to match the impedance of the signal trace on the board, which will typically be 50 ohms. Thus, to achieve a 500 mV (single ended) swing, a minimum of 10 mA of current (500 mV divided by 50 ohms) would be required. Thus, the outputs of the circuit 100 may provide 500 mV voltage swings to an application requiring only 300 mV voltage swings, resulting in 4 mA of current being wasted for each of the outputs Y and YN. In an application with a 100 ohm line to line termination, the effective impedance is 25 ohms, which requires 20 mA of current (500 mV divided by 25 ohms) to achieve 500 mV voltage swings. In this case, if the outputs of the circuit 100 provide 500 mV swings to an application requiring only 300 mV voltage swings, 8 mA of current will be wasted for each of the outputs Y and YN. Conversely, another shortcoming of prior art emitter coupled output circuits such as circuit 100 is that some applications require output voltage swings that are larger than the fixed output voltage swings provided by these circuits.

Although prior art circuits, such as those disclosed in U.S. Pat. No. 3,760,200 of Taniguchi et al., provide for reduction of fluctuations of the amplitude of circuit outputs, these circuits do not have a default operating mode where connection of an external resistor or current source is not required, and they consequently require connection of an external resistor or current source to the integrated circuit containing the output circuitry at all times.

SUMMARY OF THE INVENTION

Broadly, the invention concerns an integrated circuit having a pair of emitter coupled output transistors and an electrical connection area. The electrical connection area is connectable to an external circuit to program the magnitude of the voltage swings of the outputs. The emitter coupled outputs may be current mode logic (CML) outputs, emitter coupled logic (ECL) outputs, or outputs in other types of logic families such as CMOS and NMOS.

An illustrative embodiment of the invention is shown in FIG. 3. Like the prior art circuit 100 of FIG. 1, the integrated circuit device 300 of FIG. 3 includes a pair of emitter coupled output transistors and a current source. In that regard, the device 300 includes emitter coupled output section 302 which includes emitter coupled output transistors Q4 and Q5, current source transistor Q8, and current source resistor R8. In the prior art circuit 100 of FIG. 1 the bias voltage applied to the base of the current source transistor Q3 is fixed (except for temperature compensation), thereby causing the output drive current I101 and the magnitude of the output voltage swings to be fixed. In contrast, in the device 300 of FIG. 3 the bias voltage applied to the base of the current source transistor Q8 is variable, thereby providing for adjustment of the output drive current I301 and the resulting magnitude of the output voltage swings of outputs Y1 and YN1. Within the operational range of the circuit, the magnitude of the output voltage swings can be programmed to be as low or high as required for a particular application. Programming the magnitude of the output voltage swings also allows for the elimination of output voltage swing variation that can be introduced due to manufacturing tolerances. To save power, the magnitude of the output voltage swings can be set as small as is possible without adversely affecting circuit performance.

In order to program the magnitude of the output voltage swings, the integrated circuit device 300 of FIG. 3 includes a variable bias generator 315 that produces a bias voltage $V_{BIAS}$ that is connected to the base of the current source transistor Q8. The output drive current I301, and consequently the magnitude of the output voltage swings, are determined by the bias voltage. The variable bias generator is connected to an electrical connection area 225 of the integrated circuit device 300 of FIG. 3. An external programming circuit can be connected to the electrical connection area in order to adjust (also referred to as setting) the bias voltage, to thereby program the desired magnitude of the output voltage swings. The external programming circuit, which is shown in FIG. 3 as a resistance 307, can be a resistance or an external voltage source (and could be other types of components in other embodiments). The variable bias generator can be any of a number of circuits that produce a bias voltage that is a function of the external programming circuit connected to the electrical connection area. If adjustment of the magnitude of the emitter coupled output voltage swings is not needed, then an external programming circuit is not connected to the electrical connection area, and the electrical connection area is left floating. When the electrical connection area is left floating, the variable bias generator produces a default bias voltage that results in a default magnitude of the output voltage swings.

The magnitude of the output voltage swings in more than one emitter coupled output section may be controlled by the bias voltage produced by the variable bias generator 315. To illustrate this optional aspect of the invention, the device 300 of FIG. 3 includes a second emitter coupled output section 335, which includes emitter coupled output transistors Q6 and Q7, current source transistor Q9, and current source resistor R9. The bias voltage $V_{BIAS}$ produced by the variable bias generator is connected to the base of current source transistor Q9, in addition to being connected to the base of current source transistor Q8. Thus, the variable bias voltage applied to the bases of current source transistors Q8 and Q9 provides for adjustment of the output drive current I301 and the resulting magnitude of the voltage swings of outputs Y1 and YN1, and also provides for adjustment of the output drive current I302 and the resulting magnitude of the voltage swings of outputs Y2 and YN2. The variable bias voltage can also be applied to the current source transistors of additional emitter coupled output sections.

The invention can be implemented in various embodiments, including as an integrated circuit device in which the magnitude of the voltage swings of emitter coupled outputs is programmable, and as a method for programming the magnitude of the output voltage swings in an integrated circuit device having emitter coupled outputs.

The invention affords its users with a number of distinct advantages. Chiefly, the invention provides the ability to program the magnitude of the output voltage swings in emitter coupled outputs on integrated circuits over a wide range. Within the operational range of the circuitry, the magnitude of the output voltage swings can be adjusted to be as large or small as required for a particular application, and to also reduce variations in the magnitude of the output voltage swings caused by manufacturing tolerances. Typically, the magnitude of the output voltage swings will be decreased, although in some cases the magnitude of the output voltage swings will be increased. Reducing the magnitude of the voltage swings provides the benefits of preventing unnecessary power dissipation and heat generation, which would otherwise occur if the magnitude of the output voltage swings is unnecessarily large, and also reduces the amount of jitter. Typically, the amount of power saved is much greater than the relatively small amount of power dissipated in the external programming circuit.

Another advantage of the invention is that the invention provides for easy, "on the fly- on the circuit board" adjustment, and if necessary, readjustment, of the magnitude of the output voltage swings. Another advantage of the invention is that a single programming circuit and a single bias voltage can be used to control the magnitude of the output voltage swings of several outputs. The invention also provides other advantages and benefits, which are apparent from the following description.

BRIEF DESCRIPTION OF THE DRAWINGS

FIG. 1 is a schematic diagram of a prior art buffer that has emitter coupled outputs.

FIG. 2 is a block/schematic diagram of an integrated circuit device in accordance with an illustrative embodiment of the invention, connected to an external programming circuit.

FIG. 3 is a schematic diagram of an integrated circuit device in accordance with an illustrative embodiment of the invention, connected to an external programming circuit.

FIG. 4A is a schematic diagram of a variable bias generator and an electrical connection area in accordance with an illustrative embodiment of the invention.

FIG. 4B is a schematic diagram of another variable bias generator and an electrical connection area in accordance with an illustrative embodiment of the invention.

FIG. 4C is a schematic diagram of another variable bias generator and an electrical connection area in accordance with an illustrative embodiment of the invention.

FIG. 4D is a schematic diagram of a buffer circuit in accordance with an illustrative embodiment of the invention.

FIG. 5 is a plan view of an integrated circuit device in accordance with an illustrative embodiment of the invention.

DETAILED DESCRIPTION OF THE PREFERRED EMBODIMENTS

Figure 6:
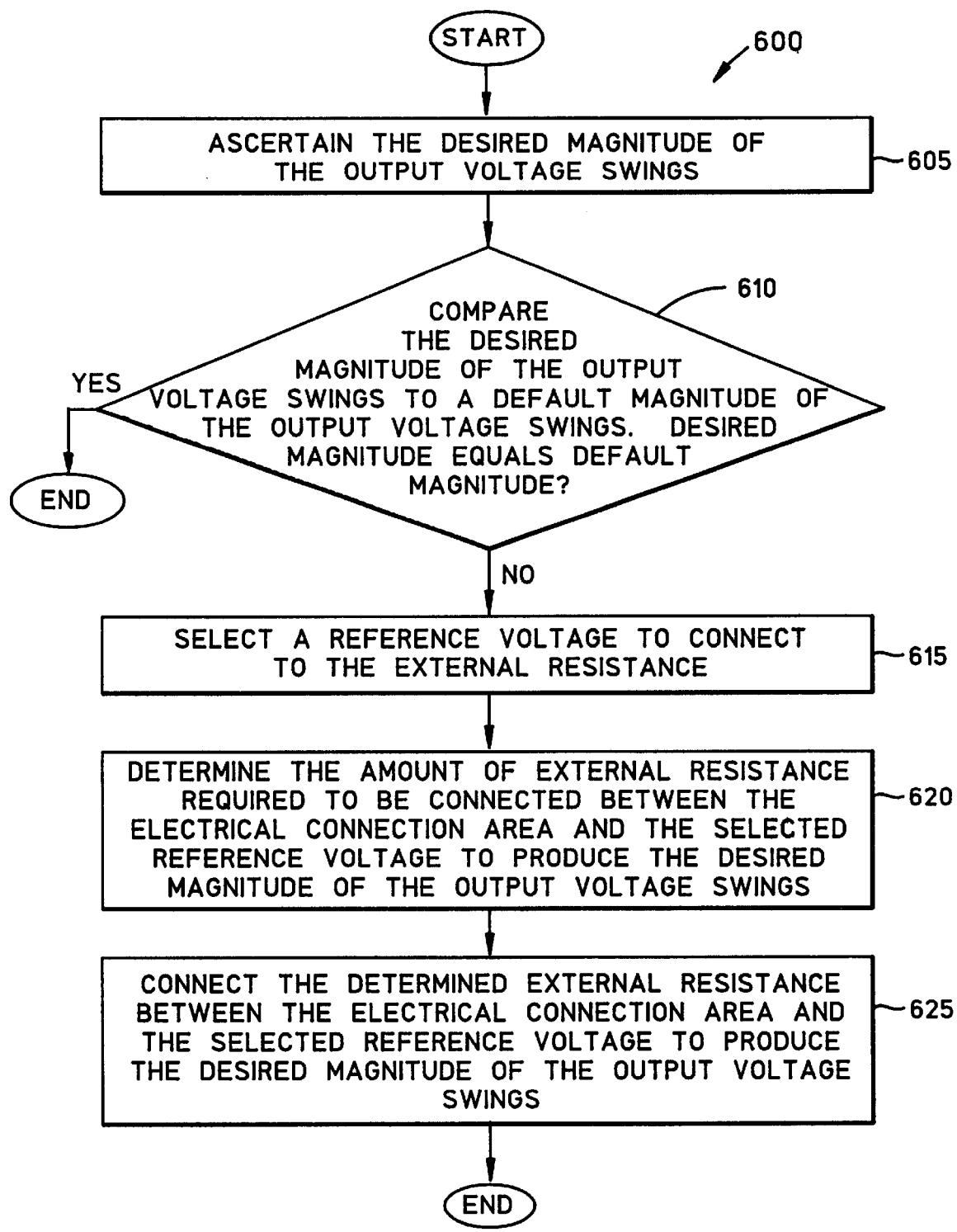
FIG. 6 is a flow chart of a method for adjusting the magnitude of the output voltage swings in an integrated circuit device having emitter coupled outputs, in accordance with an illustrative embodiment of the invention.

The nature, objects, and advantages of the invention will become more apparent to those skilled in the art after considering the following detailed description in connection with the accompanying drawings.

Broadly, the invention concerns an integrated circuit having a pair of emitter coupled output transistors and an electrical connection area. The electrical connection area is connectable to an external circuit to program the magnitude of the voltage swings of the outputs. The invention can be implemented in various embodiments, including as an integrated circuit device in which the magnitude of the output voltage swings of the outputs is programmable, and as a method for programming the magnitude of the output voltage swings in an integrated circuit device having emitter coupled output transistors.

HARDWARE COMPONENTS AND INTERCONNECTIONS

A. Emitter Coupled Output Sections

FIG. 2 is a block/schematic diagram of the circuitry of an integrated circuit device 200 in accordance with an illustrative embodiment of the invention, connected to an external programming circuit 230. Integrated circuit device 200 includes a first emitter coupled output section 202. The first emitter coupled output section 202 includes first output transistor Q4, a second output transistor Q5, a first output resistor R4, a second output resistor R5, and a current source 205. The emitters of first output transistor Q4 and second output transistor Q5 are connected at an emitter node EN1. The collector of the first output transistor Q4 is connected to a first output YN1. The collector of the second output transistor Q5 is connected to a second output Y1. The collector of the firs t output transistor Q4 is connected to a first end of first output resistor R4 that is connected to the first output YN1. A second end of first output resistor R4 is connected to a first reference voltage, designated as Vcc. The collector of the second output transistor Q5 is connected to a first end of second output resistor R5 that is connected to the second output Y1. A second end of first output resistor R5 is connected to the first reference voltage, designated as Vcc. The first emitter node EN1 is connected to (and in series with) a first end of the current source 205. A second end of the current source is connected to a second reference voltage, designated as $V_{REF2}$ (which is preferably ground). The current source 205 has a bias voltage input 210 for controlling the amount of current through the current source.

An input A1 is connected to the base of the first output transistor Q4, and a second input AN1 is connected to the base of the second output transistor Q5. The emitter coupled output section 202 is configured for use with complimentary input signals, such that the signal at input AN1 is the logical compliment of the signal at input A1. When a logic level high signal is connected to input A1 (and a corresponding logic level low signal is connected to input AN1) a logic level high signal is produced at second output Y1, and a logic level low signal is produced at first output YN1. Conversely, when a logic level low signal is connected to input A1 (and a corresponding logic level high signal is connected to input AN1) a logic level low signal is produced at second output Y1, and a logic level high signal is produced at first output YN1. The signals connected to inputs A1 and AN1 are typically the outputs of preceding logic circuitry.

A typical (and preferred) output load 227 is shown connected to outputs Y1 and YN1 in FIG. 2. Output load 227 includes first load capacitor CL1, second load capacitor CL2, first transmission line TL1, second transmission line TL2, and load resistor RL. Load resistor RL preferably is about 100 ohms, first load capacitor CL1 and second load capacitor CL2 are each preferably about 0.01 microfarads, and first transmission line TL1 and second transmission line TL2 each preferably have a characteristic impedance of about fifty (50) ohms.

Although not required, preferably integrated circuit device 200 also includes a second emitter coupled output section 235. Typically, emitter coupled output section 235 is identical to first emitter coupled output section 202, although this is not required. The dots 250 in FIG. 2 indicate that additional emitter coupled output sections (and/or emitter follower output sections discussed below) may also be included, although this also is not required.

The second emitter coupled output section 235 includes first output transistor Q6, a second output transistor Q7, a first output resistor R6, a second output resistor R7, and a current source 240. The emitters of first output transistor Q6 and first output transistor Q7 are connected at an emitter node EN2. The collector of the first output transistor Q6 is connected to a first output YN2. The collector of the second output transistor Q7 is connected to a second output Y2. The collector of the first output transistor Q6 is connected to a first end of first output resistor R6 that is connected to the first output YN2. A second end of first output resistor R6 is connected to the first reference voltage, designated Vcc. The collector of the second output transistor Q7 is connected to a first end of second output resistor R7 that is connected to the second output Y2. A second end of first output resistor R7 is connected to the first reference voltage, Vcc. The first emitter node EN2 is connected to (and in series with) a first end of the current source 240. A second end of the current source is connected to the second reference voltage, $V_{REF2}$. The current source 240 has a bias voltage input 245 for controlling the amount of current through the current source.

An input A2 is connected to the base of the first output transistor Q6, and a second input AN2 is connected to the base of the second output transistor Q7. The emitter coupled output section 235 is configured for use with complimentary input signals, such that the signal at input AN2 is the logical compliment of the signal at input A2. When a logic level high signal is connected to input A2 (and a corresponding logic level low signal is connected to input AN2) a logic level high signal is produced at second output Y2, and a logic level low signal is produced at first output YN2. Conversely, when a logic level low signal is connected to input A2 (and a corresponding logic level high signal is connected to input AN2) a logic level low signal is produced at second output Y2, and a logic level high signal is produced at first output YN2. The signals connected to inputs A2 and AN2 are typically the outputs of preceding logic circuitry. Preferably a load similar to load 227 is connected to outputs Y2 and YN2.

Optionally, the integrated circuit device 200 may include at least one emitter follower output transistor, such as emitter follower output transistors Q18 and Q19, which are illustrated in emitter coupled output section 235. The collectors of emitter follower output transistors Q18 and Q19 are connected to the first reference voltage, Vcc. The base of emitter follower output transistor Q18 is connected to output YN2. Similarly, the base of emitter follower output transistor Q19 is connected to output Y2. The emitter of emitter follower output transistor Q18 is connected to pad P1, where output YYN2 is generated. Similarly, the emitter of emitter follower output transistor Q19 is connected to pad P2, where output YY2 is generated. If emitter follower output transistors Q18 and Q19 are added to emitter coupled output section 235, then the outputs from emitter coupled output section 235 are outputs YYN2 and YY2, rather than outputs YN2 and Y2. Resistors R23 and R24 terminate the outputs YYN2 and YY2, respectively and provide a means for discharging them. A first end of load resistor R23 is connected to pad P1 and a second end of load resistor R23 is connected to a third reference voltage $V_{TT}$. Similarly, a first end of load resistor R24 is connected to pad P2 and a second end of load resistor R24 is connected to the third reference voltage $V_{TT}$. Typically $V_{TT}$ equals Vcc minus two volts.

Optionally, the integrated circuit device 200 may include at least one emitter follower output section, such as emitter follower output sections 255 and 260 illustrated in FIG. 2. Emitter follower output section 255 includes emitter follower output section transistor Q20 and emitter follower current source 265. Emitter follower current source 265 is connected in series with the emitter of emitter follower output section transistor Q20. Similarly, emitter follower current source 270 is connected in series with the emitter of emitter follower output section transistor Q21. Emitter follower output section 255 has an input B at the base of emitter follower output section transistor Q20, and emitter follower output section 260 has an input BN at the base of emitter follower output section transistor Q21. Emitter follower current source 265 has an emitter follower current source bias voltage input 275 for controlling the amount of current through emitter follower current source 265. Similarly, emitter follower current source 270 has an emitter follower current source bias voltage input 280 for controlling the amount of current through emitter follower current source 270. The bias voltage produced at the output 220 of the variable bias generator 215 is connected to the emitter follower current source bias voltage inputs 275, 280. Thus, the bias voltage $V_{BIAS}$ can be used to control the magnitude of the output voltage swings of the outputs of the emitter coupled output sections 202, 235, and to control the amount of current through the emitter follower output sections 255, 260.

Optionally, the outputs of one or more emitter follower output sections, such as output Z of emitter follower output section 255, and output ZN of emitter follower output section 260, may be connected to the inputs of one or more respective emitter follower output sections, such as inputs A2 and AN2 of emitter coupled output section 235.

B. Variable Bias Generator and Electrical Connection Area

The integrated circuit device 200 also includes variable bias generator 215 that has an output 220. The variable bias generator 215 produces a bias voltage $V_{BIAS}$ at the output 220 of the variable bias generator. The output 220 of the variable bias generator 215 is connected to the bias voltage input 210 of current source 205 for controlling the amount of current through the current source 205 to control the magnitude of the voltage swings of the outputs Y1 and YN1. Although not required, preferably, as shown in FIG. 2, the output 220 of the variable bias generator 215 is also connected to the bias voltage input 245 of current source 240 for controlling the amount of current through the current source 240 to control the magnitude of the voltage swings of outputs Y2 and YN2. If additional emitter coupled output sections are included in the device 200, preferably, the output 220 of the variable bias generator is connected to a bias voltage input of the current source of each emitter coupled output section, although this is not required. Connecting a single bias voltage to the bias voltage inputs of the current sources of several, or many, emitter coupled outputs is preferred for many applications, and provides for controlling the magnitude of the output swings of many emitter coupled outputs with a single external programming circuit (discussed below). Although not required, in many applications it is desirable to program the magnitude of the output voltage swings of emitter coupled output sections to be the same as the magnitude of the output voltage swings of other emitter coupled output sections. This can be easily accomplished by connecting a single bias voltage to the bias voltage inputs of the current sources of substantially similar emitter coupled output sections.

The integrated circuit device 200 also includes an electrical connection area 225 that is connected to the variable bias generator 215. The electrical connection area 225 is configured for connection to an external programming circuit 230. If it is desired to change the magnitude of the voltage swings of the emitter coupled output sections that are connected to the output 220 of the variable bias generator 215 to other than their default values, then an external programming circuit 230 is connected to the electrical connection area 225. Connecting the external programming circuit 230 to the electrical connection area 225 causes the bias voltage at the output of the variable bias generator to be set to a value other than the default bias voltage value.

Changing the bias voltage $V_{BIAS}$ at the output of the variable bias generator 215 produces a change in the amount of current through the current sources of emitter coupled output sections whose bias voltage inputs are connected to the bias voltage. Thus, for the emitter coupled output sections whose current sources are controlled by the bias voltage, the external programming circuit is used adjust the amount of current through the current sources to thereby program (adjust) the magnitude of the voltage swings of the outputs.

C. External Programming Circuit

The external programming circuit 230 can be any circuit that causes the bias voltage $V_{BIAS}$ to change from the default value to a desired value. Typically, the external programming circuit 230 is a resistance or an external voltage source. However, alternative embodiments of the variable bias generator could be designed for which the external programming circuit could be a current source.

The external programming circuit 230 can be used to either decrease or increase the magnitude of the output voltage swings. The external programming circuit will be used to increase the magnitude of the output voltage swings if the default value of the output voltage swings is not as large as desired. Conversely, the external programming circuit will be used to decrease the magnitude of the output voltage swings if the default value of the output voltage swings is larger than necessary. Reducing the magnitude of unnecessarily large voltage swings provides the benefits of preventing unnecessary power dissipation and heat generation, and also reduces jitter. Smaller output voltage swings tend to reduce jitter, because with smaller voltage swings the voltage is more likely to reach the steady state voltage between transitions.

Preferably, the external programming circuit 230 is a resistance. The resistance may comprise one or more resistive components, and is preferably one resistor 307 as shown in FIG. 3. A first end of the resistance is connected to the electrical connection area 225, and a second end of the resistance is connected to a reference voltage. If the reference voltage that the second end of the resistance is connected to is ground, then the bias voltage will decrease, resulting in a decrease in the magnitude of the output voltage swings. Conversely, if the reference voltage that the second end of the resistance is connected to is Vcc (as shown in FIG. 3), then the bias voltage will increase, resulting in an increase in the magnitude of the output voltage swings. The amount of resistance used for the external programming circuit is a function of the desired magnitude of the output voltage swings and of the circuitry used for the variable bias generator 215.

In the alternative embodiment where the external programming circuit 230 is an external voltage source, the bias voltage and consequently the magnitude of the output voltage swings can be increased or decreased, with higher external voltages producing higher magnitude output voltage swings than lower external voltages. The amount of voltage used for the external voltage source is a function of the desired magnitude of the output voltage swings and of the circuitry used for the variable bias generator 215. For the variable bias generator 315 of FIG. 3, and the variable bias generator 425 of FIG. 4C, the external voltage effectively overrides the effect of the variable bias generator, with the result that the bias voltage is the external voltage. For the variable bias generator 405 of FIG. 4A, and the variable bias generator 415 of FIG. 4B, the bias voltage is the external voltage minus Vbe (with Vbe being the base-emitter voltage of transistor Q13 for variable bias generator 405, or the base-emitter voltage of transistor Q16 for variable bias generator 415). The voltage of the external voltage source can be adjusted over an operating range consistent with the value of the power supply. For example, if the integrated circuit device is to operate at 3.3 volts, then the voltage of the external voltage source could be set in a range from between about zero volts to about 3.3 volts to select the desired magnitude of the output voltage swings. The desired voltage for the external voltage source can be obtained in a number of ways known in the art, for example with two resistors connected as a voltage divider across the power supply voltage. Another example is obtaining the desired external voltage from the output of a digital to analog converter.

For embodiments of the invention where an external voltage source is always connected to the electrical connection area 225, the variable bias generator need not include anything more than a connection between the electrical connection area 225 and the bias voltage inputs of any current sources to be controlled by the external voltage.

D. Current Sources

The current sources 205 and 240 can be any current sources for which the amount of current through the respective current source is a function of the voltage at the respective bias voltage input 210, 245. Preferably, the current sources are implemented as current sources 305 and 340 as shown in FIG. 3. Current source 305 consists of transistor Q8 and resistor R8, and current source 340 consists of transistor Q9 and resistor R9. For current source 305, resistor R8 is connected in series with the emitter of transistor Q8, with one end of resistor R8 connected to the emitter of transistor Q8, and the other end of resistor R8 connected to a the second reference voltage, which is preferably ground. Similarly, for current source 340, resistor R9 is connected in series with the emitter of transistor Q9, with one end of resistor R9 connected to the emitter of transistor Q9, and the other end of resistor Rg connected to a the second reference voltage. The respective currents through these current sources are determined by the voltage at the respective bias voltage inputs 310, 345, and the values of the respective resistors R8, R9. In this preferred embodiment of the current sources, the base of transistor Q8 is the bias voltage input 310 of current source 305, and the base of transistor Q9 is the bias voltage input 345 of current source 340. With these preferred embodiments of the current sources the collector of current source transistor Q8 is connected to emitter node EN1, and the collector of current source transistor Q9 is connected to emitter node EN2.

E. Buffer Circuit

In order to isolate and prevent interaction between the current sources of different emitter coupled output sections and/or different emitter follower output sections, an optional buffer circuit 450 illustrated in FIG. 4D can be used. Use of the buffer circuit is preferred for applications where isolation of the current sources is important. To incorporate the buffer circuit into the integrated circuit device, the bias voltage $V_{BIAS}$ is connected to input 455 of the buffer circuit. Bias voltage output 460 of the buffer circuit is connected to one current source bias voltage input, such as bias voltage input 210 of current source 205 in FIG. 2. Bias voltage output 465 of the buffer circuit is connected to the current source bias voltage input of a different current source, such as bias voltage input 245 of current source 240 in FIG. 2. The dots 470 in FIG. 4D indicate that additional buffer output modules like buffer output modules 475a and 475b may be included in buffer 450. The outputs of additional buffer output modules can be connected to the bias voltage inputs of respective additional current sources.

Buffer circuit 450 includes a buffer input module 473 that includes first buffer resistor R25, that has a first end connected to the first reference voltage, Vcc, and a second end connected to the collector of first buffer transistor Q22. The base of the first buffer transistor Q22 is connected to the input 455 of the buffer circuit. The emitter of the first buffer transistor Q22 is connected to a first end of a second buffer resistor R26. The second end of the second buffer resistor R26 is connected to the second reference voltage $V_{REF2}$.

Buffer circuit 450 also includes at least two output modules such as output buffer modules 475a and 475b. Output buffer module 475a includes second buffer transistor Q23. The collector of second buffer transistor Q23 is connected to the first reference voltage, Vcc. The base of second buffer transistor Q23 is connected to the collector of first buffer transistor Q22. Output buffer module 475a also includes a third buffer resistor R27 having a first end connected to the emitter of the second buffer transistor Q23 and a second end connected to the second reference voltage $V_{REF2}$ (which is preferably ground). Output buffer module 475a also includes a third buffer transistor Q24. The collector of the third buffer transistor Q24 is connected to the first reference voltage, Vcc. The base of the third buffer transistor Q24 is connected to the emitter of the second buffer transistor Q23. The emitter of the third buffer transistor Q24 is connected to bias voltage output 460 of the buffer output module 475a. Output buffer module 475a also includes fourth buffer resistor R28 that has one end connected to the emitter of third buffer transistor Q24, and a second end connected to the second reference voltage $V_{REF2}$.

Output buffer module 475b includes fourth buffer transistor Q25. The collector of fourth buffer transistor Q25 is connected to the first reference voltage, Vcc, and the base of fourth buffer transistor Q25 is connected to the collector of first buffer transistor Q22. Output buffer module 475b also includes a fifth buffer resistor R29 having a first end connected to the emitter of the fourth buffer transistor Q25 and a second end connected to the second reference voltage $V_{REF2}$. Output buffer module 475b also includes a fifth buffer transistor Q26. The collector of the fifth buffer transistor Q26 is connected to the first reference voltage, Vcc. The base of the fifth buffer transistor Q26 is connected to the emitter of the fourth buffer transistor Q25. The emitter of the fifth buffer transistor Q26 is connected to bias voltage output 465 of the buffer output module 475b. Output buffer module 475b also includes sixth buffer resistor R30 that has one end connected to the emitter of fifth buffer transistor Q26, and a second end connected to the second reference voltage $V_{REF2}$.

F. Preferred Embodiment of the Variable Bias Generator

FIG. 3 illustrates the preferred embodiment of the integrated circuit device 300, including the preferred embodiment 315 of the variable bias generator 215 of FIG. 2. Preferred variable bias generator 315 includes a variable bias generator first resistor R10 that has a first end connected to the first reference voltage, and a second end connected to the electrical connection area 225. A variable bias generator second resistor R11 has a first end connected to the electrical connection area 225. A variable bias generator third resistor R12 has a first end connected to a second end of the variable bias generator second resistor R11, and a second end connected to the second reference voltage. A variable bias generator transistor Q10 has a collector connected to the electrical connection area 225, a base connected to the second end of the variable bias generator second resistor R11 and to the first end of the variable bias generator third resistor R12, and an emitter connected to the second reference voltage. A variable bias generator capacitor C1 has a first end connected to the electrical connection area, and a second end connected to the second reference voltage. In this embodiment of the variable bias generator 315, the output 320 of the variable bias generator 315 is connected to the electrical connection area 225. The output 320 is also connected to the bias voltage inputs 310 and 345 of current sources 305 and 340. In many applications it will be preferred to include additional emitter coupled output sections in the device 300, in which case the output 320 would preferably be connected to the bias voltage inputs of the additional emitter coupled output sections. Bias voltage $V_{BIAS}$ is produced at the output 320 of the variable bias generator 315.

G. First Alternative Embodiment of the Variable Bias Generator

FIG. 4A illustrates a first alternative embodiment 405 of the variable bias generator 215 of FIG. 2. This alternative variable bias generator 405 includes a variable bias generator first resistor R13 that has a first end connected to the first reference voltage, and a second end connected to the electrical connection area 225. A variable bias generator second resistor R14 has a first end connected to the electrical connection area 225. A variable bias generator third resistor R15 has a first end connected to a second end of the variable bias generator second resistor R14. A variable bias generator first transistor Q11 has a collector connected to the electrical connection area 225, a base connected to the second end of the variable bias generator second resistor R14 and to the first end of the variable bias generator third resistor R15, and an emitter connected to a second end of the variable bias generator third resistor R15. A variable bias generator second transistor Q12 has a collector and a base that are connected to the emitter of the variable bias generator first transistor Q11 and to the second end of the variable bias generator third resistor R15, and an emitter that is connected to the second reference voltage. A variable bias generator third transistor Q13 has a collector connected to the first reference voltage, a base connected to the electrical connection area 225, and an emitter. A variable bias generator fourth transistor Q14 has a collector connected to the emitter of the variable bias generator third transistor Q13, a base connected to the base of the variable bias generator second transistor 012, and an emitter connected to the second reference voltage. A variable bias generator capacitor C2 has a first end connected to the collector of variable bias generator fourth transistor Q14, and a second end connected to the second reference voltage. The output 410 of the variable bias generator 405 is connected to the emitter of the variable bias generator third transistor Q13 and to the collector of the variable bias generator fourth transistor Q14. The output 410 is for connection to the bias voltage inputs of the current sources of emitter coupled output sections (and possibly also to the current sources of emitter follower output sections), such as bias voltage inputs 210 and 245 of current sources 205 and 240. Bias voltage $V_{BIAS}$ is produced at the output 410 of the variable bias generator 405.

H. Second Alternative Embodiment of the Variable Bias Generator

FIG. 4B illustrates a second alternative embodiment 415 of the variable bias generator 215 of FIG. 2. This alternative variable bias generator 415 includes a variable bias generator first resistor R16 that has a first end connected to the first reference voltage, and a second end connected to the electrical connection area 225. A variable bias generator second resistor R17 has a first end connected to the electrical connection area 225. A variable bias generator capacitor C3 has a first end connected to a second end of the variable bias generator second resistor R17. A variable bias generator first transistor Q15 has a collector connected to the first end of the variable bias generator capacitor C3 and to the second end of the variable bias generator second resistor R17, a base connected to a second end of the variable bias generator capacitor C3, and an emitter connected to the second reference voltage. A variable bias generator second transistor Q16 has a collector connected to the first reference voltage, a base connected to the electrical connection area 225, and an emitter connected to an output 420 of the variable bias generator 415. A variable bias generator third resistor R18 has a first end connected to the output 420. A variable bias generator third transistor Q17 has a collector connected to a second end of the variable bias generator third resistor R18, a base, and an emitter. A variable bias generator fourth resistor RI9 has a first end connected to the emitter of the variable bias generator third transistor Q17, and a second end connected to the second reference voltage. A variable bias generator fifth resistor R20 has a first end connected to the output 420, and a second end connected to the base of the variable bias generator third transistor Q17. A variable bias generator diode D1 has an anode connected to the base of the variable bias generator third transistor Q17, and a cathode connected to the second reference voltage. The output 420 is for connection to the bias voltage inputs of the current sources of emitter coupled output sections (and possibly also to the current sources of emitter follower output sections), such as bias voltage inputs 210 and 245 of current sources 205 and 240. Bias voltage $V_{BIAS}$ is produced at the output 420 of the variable bias generator 415.

I. Third Alternative Embodiment of the Variable Bias Generator

FIG. 4C illustrates a third alternative embodiment 425 of the variable bias generator 215 of FIG. 2. This alternative variable bias generator 425 includes a variable bias generator first resistor R21 that has a first end connected to the first reference voltage, and a second end connected to the electrical connection area 225. A variable bias generator diode D2 has an anode connected to the electrical connection area 225, and a cathode. A variable bias generator second resistor R22 has a first end connected to the cathode of the variable bias generator diode, and a second end connected to the second reference voltage. A variable bias generator capacitor C4 has a first end connected to the electrical connection area 225, and a second end connected to the second reference voltage. An output 430 of the variable bias generator 425 is connected to the electrical connection area 225. The output 430 is for connection to the bias voltage inputs of the current sources Adof emitter coupled output sections (and possibly also to the current sources of emitter follower output sections), such as bias voltage inputs 210 and 245 of current sources 205 and 240. Bias voltage $V_{BIAS}$ is produced at the output 430 of the variable bias generator 425.

J. Typical Component Values

The following values are illustrative of typical resistor and capacitor values used to implement the circuits described herein. However, these values are not required, and the circuits described herein may be implemented with component values other than, and in many cases substantially different than, the following illustrative component values. Illustrative values for resistors and capacitors shown in FIGS. 2, 3, 4A, 4B, 4C, and 4D are as follows:

R4=50 ohms
R5=50 ohms
R6=50 ohms
R7=50 ohms

R8=20 ohms
R9=20 ohms
R10=800 ohms
R11=500 ohms
R12=2K ohms
R13=500 ohms
R14=500 ohms
R15=2K ohms
R16=4k ohms
R17=2.5K ohms
R18=550 ohms
R19=50 ohms
R20=400 ohms
R21=2.2K ohms
R22=200 ohms
R23=50 ohms
R24=50 ohms
R25=2K ohms
R26=500 ohms
R27=2K ohms
R28=3K ohms
R29=2K ohms
R30=3K ohms
C1=2 picofarads
C2=2picofarads
C3=2 picofarads
C4=2 picofarads K. Plan View of Integrated Circuit Device FIG. 5 shows an integrated circuit device 500, which can be made with any of a number of known integrated circuit manufacturing processes. Integrated circuit device 500 includes electrical connection area 225, and also includes the variable bias generator 215, the first emitter coupled output section 302, and the second emitter coupled output section 335. The electrical connection area 225 can be an electrically conducting pin, pad, or other type of conductive area. The variable bias generator 215, first emitter coupled output section 302 (including current source 305) and the second emitter coupled output section 335 (including current source 340), may cumulatively be referred to as a circuit 502. Circuit 502 and device 500 need not include second emitter coupled output section 335.

Device 500 also preferably includes other circuits 505, 510, and 515, which can generally be any type of digital and/or analog circuits. Preferably, circuits 505, 510, and 515 are digital logic circuits. Circuit 515 is typically a digital logic circuit that is connected to emitter coupled output sections 302 and 335. Signal lines 520a and 520b connect circuit 515 to emitter coupled output section 302, and signal lines 525a and 525b connect circuit 515 to emitter coupled output section 335. Signal lines 520a and 520b preferably transmit signals from circuit 515 to inputs A1 and AN1 of emitter coupled output section 302. Similarly, signal lines 525a and 525b preferably transmit signals from circuit 515 to inputs A2 and AN2 of emitter coupled output section 335. Other circuits 505, 510, and/or 515 may be connected to additional emitter coupled output sections (and possibly also to emitter follower output sections) that may optionally be included in circuit 502. Also, additional other circuits in addition to other circuits 505, 510, and 515 may be included in device 500, and one or more of these additional other circuits may be connected to additional emitter coupled output sections (and possibly also to emitter follower output sections) that may optionally be included in circuit 502.

METHODS

In addition to the hardware embodiments described herein, another aspect of the invention concerns methods for programming the magnitude of the output voltage swings of outputs in an integrated circuit device having emitter coupled output transistors and an electrical connection area. Although the methods may be practiced with any of a number of circuit configurations, for clarity of explanation, but with no limitation intended thereby, the tasks of the methods are described in the context of the circuits of FIGS. 2–5. Also, although the methods may be described in terms of programming the output current of a single emitter coupled output section, the methods may be used to program the output currents of one, two, or more emitter coupled output sections, and are preferably used to program the output currents of several emitter coupled output sections.

For the methods described herein, the magnitude of the output voltage swings is a function of the bias voltage produced by the variable bias generator. The magnitude of each output voltage swing is also a function of the respective collector load resistor R4, R5, R6, or R7. If a current source such as current source 305 (which includes current source resistor R8) or current source 340 (which includes current source resistor R9) is used, then the magnitude of the respective output voltage swings is also a function of the value of the respective current source resistor R8 or R9.

A. External Resistance

The first method is for programming the magnitude of the output voltage swings of an integrated circuit device having emitter coupled output transistors and an electrical connection area. In this method, the magnitude of the output voltage swings is a function of a reference voltage and of the amount of external resistance connected between the electrical connection area and the reference voltage. For this method, the external programming circuit 230 of FIG. 2 is a resistance, referred to as an external resistance.

This method is illustrated by the tasks 600 of the flowchart in FIG. 6. In task 605, the desired magnitude of the output voltage swings for a particular application is ascertained. In task 610, the desired magnitude of the output voltage swings is compared to a default magnitude of the output voltage swings. If the desired magnitude of the output voltage swings is equal to the default magnitude of the output voltage swings, then there is no need to program the magnitude of the output voltage swings, and therefore there is no need to perform the remaining tasks of the method. However, if the desired magnitude is not equal to the default magnitude, then the comparison is continued to determine whether the desired magnitude is larger or smaller than the default magnitude.

In task 615, a reference voltage to be connected to the external resistance is selected. If the desired magnitude is larger than the default magnitude, then Vcc is the selected reference voltage. If the desired magnitude is smaller than the default magnitude, then ground is the selected reference voltage.

In task 620 the amount of external resistance that is required to be connected between the electrical connection area 225 and the selected reference voltage in order to produce the desired magnitude of the output voltage swings is determined. The bias voltage produced by the variable bias generator is a function of the amount of external resistance connected between the electrical connection area 225 and the selected reference voltage. The amount of external resistance to be connected in order to produce the desired bias voltage is a function of the circuitry used for the variable bias generator. For the integrated circuit device 300 of FIG. 3, the magnitude of the output voltage swings $V_{SWING}$ of outputs Y1 and YN1 as a function of the bias voltage $V_{BIAS}$ is closely approximated by the following formula:

$$V_{SWING}=(V_{BIAS}-V_{beQ8}-V_{REF2})(R4/R8).$$

(This equation and the following equations are for the case of no load.)

For the variable bias generator 315 in FIG. 3, the bias voltage as a function of the external resistance, when the external resistance is connected to ground, is closely approximated by the following formula: $V_{BIAS}=(1+R11/R12)((kT/q)\ln(I_{CQ10}/I_{SQ10}))$, wherein $I_{CQ10}=((VCC-V_{BIAS})/R10)-(V_{BIAS}/R_{EXT})-((kT/q)\ln(I_{CQ10}/I_{SQ10}))(1/R12)$, and where $V_{BIAS}$ is the bias voltage, $I_{CQ10}$ is the collector current of transistor Q10, "ln" is the mathematical operator for the natural logarithm, k is Boltzmann's constant (1.38× 10exp−23 J/K), T is the temperature in degrees Kelvin, q is the charge of an electron (1.602×10exp−19 C), $I_{SQ10}$ is the saturation current of transistor Q10, and $R_{EXT}$ is the value of the resistance used for the external programming circuit.

For the variable bias generator 315 in FIG. 3, the bias voltage as a function of the external resistance, when the external resistance is connected to Vcc, is closely approximated by the following formula:

$$V_{BIAS}=(1+(R11/R12))((kT/q)\ln(I_{CQ10}/I_{SQ10}))$$

wherein $I_{CQ10}=((VCC-V_{BIAS})(1/R10+1/R_{EXT})-((kT/q)\ln(I_{CQ10}/I_{SQ10}))(1/R12)$.

For the integrated circuit device 300 (which includes the variable bias generator 315), equations closely approximating the magnitude of the output voltage swings as a function of the external resistance can be derived from the above equations relating to variable bias generator 315.

When the variable bias generator 405 is used in the integrated circuit device 300 instead of the variable bias generator 315, the magnitude of the output voltage swings $V_{SWING}$ of outputs Y1 and YN1 as a function of the bias voltage $V_{BIAS}$ is also closely approximated by the following formula:

$$V_{SWING}=(V_{BIAS}-V_{beQ8}-V_{REF2})(R4/R8).$$

For the variable bias generator 405 in FIG. 4A, the bias voltage as a function of the external resistance, when the external resistance is connected to ground, is closely approximated by the following formula: $V_{BIAS}=(1+(R14/R15))((kT/q)\ln(I_{CQ11}/I_{SQ11}))$, wherein $I_{CQ11}=((Vcc-V_{N1})/R13)-(V_{N1}/R_{EXT})-((1/R15)(kT/q)\ln(I_{CQ11}/I_{SQ11}))$, and where N1 is the node designated "N1" in FIG. 4A, $V_{N1}$ is the voltage at node N1, and $I_{SQ11}$ is the saturation current of transistor Q11.

For the variable bias generator 405 in FIG. 4A, the bias voltage as a function of the external resistance, when the external resistance is connected to Vcc, is closely approximated by the following formula:

$$V_{BIAS}=(1+(R14/R15))((kT/q)\ln(I_{CQ11}/I_{SQ11})),$$

wherein $I_{CQ11}=((Vcc-V_{N1})/R13)+((Vcc-V_{N1})/R_{EXT})-((1/R15)(kT/q)\ln(I_{CQ11}/I_{SQ11}))$.

When the variable bias generator 405 is used in the integrated circuit device 300 instead of the variable bias generator 315, equations closely Ian approximating the magnitude of the output voltage swings as a function of the external resistance can be derived from the above equations relating to bias generator 405. Persons of ordinary skill in the art will be able to derive similar equations for the circuits of FIGS. 4B and 4C.

In task 625 the amount of external resistance determined in task 620 is connected between the electrical connection area and the selected reference voltage, to thereby produce the desired magnitude of the output voltage swings.

B. External Voltage

Another aspect of the invention is a second method for programming the magnitude of the output voltage swings of outputs in an integrated circuit device that has emitter coupled output transistors and an electrical connection area. With this method, the magnitude of the output voltage swings is a function of the amount of the external voltage connected between the electrical connection area and a reference voltage (which will usually be ground).

Figure 7:
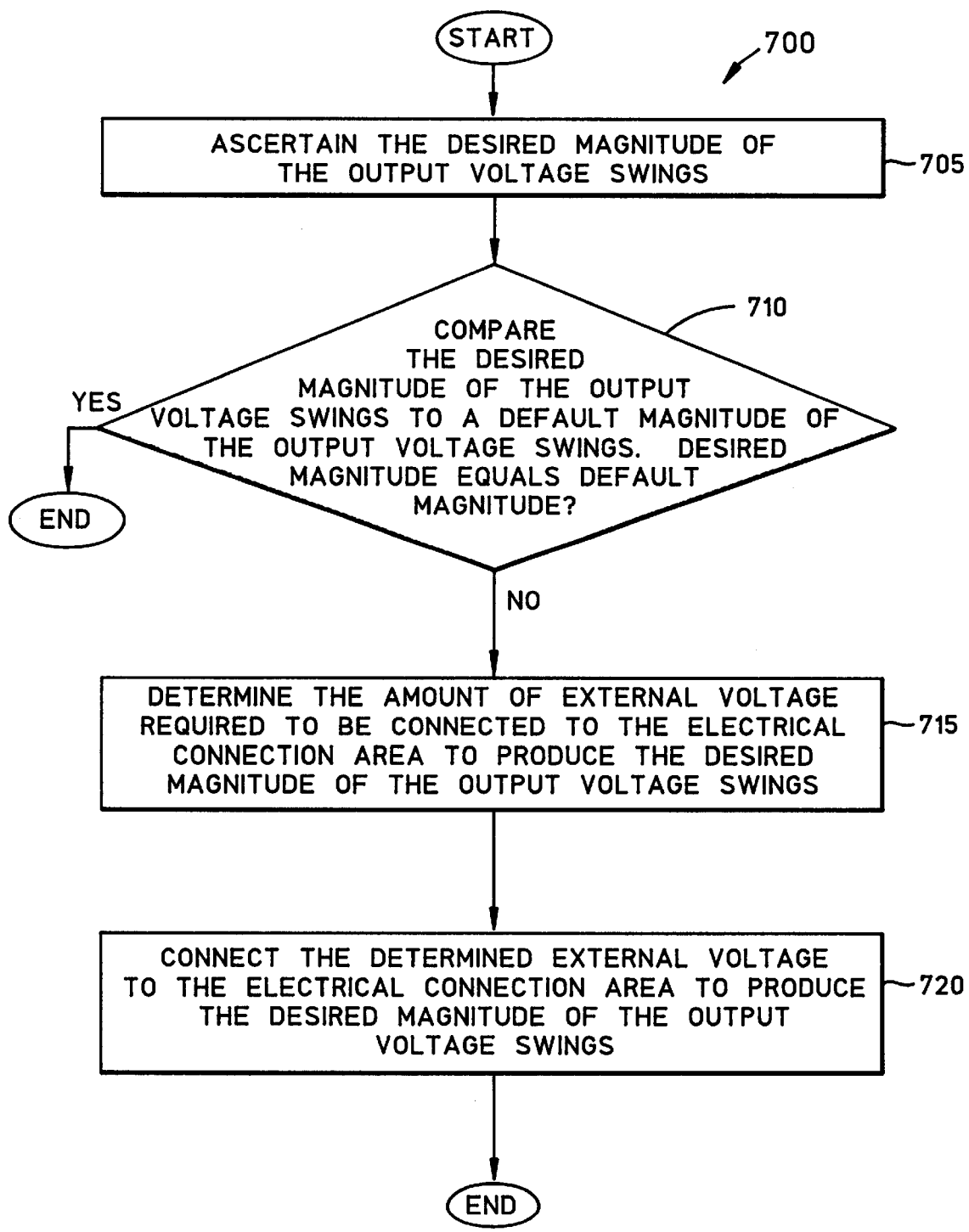
FIG. 7 is a flow-chart of another method for adjusting the magnitude of the output voltage swings in an integrated circuit device having emitter coupled outputs, in accordance with an illustrative embodiment of the invention.

For this method, the external programming circuit 230 of FIG. 2 is an external voltage source. This method is illustrated by the tasks 700 of the flowchart in FIG. 7. In task 705, the desired magnitude of the output voltage swings for a particular application is ascertained. In task 710, the desired magnitude of the output voltage swings is compared to the default magnitude of the output voltage swings. If the desired magnitude of the output voltage swings is equal to the default magnitude of the output voltage swings, then there is no need to program the magnitude of the output voltage swings, and therefore there is no need to perform the remaining tasks of the method. If the desired magnitude is not equal to the default magnitude, then the method is continued. In task 715 the amount of external voltage required to be connected to the electrical connection area in order to produce the desired magnitude of the output voltage swings is determined.

In the case of the circuit 300 of FIG. 3, the bias voltage is equal to the external voltage connected to the electrical connection area, with the external voltage effectively overriding the default bias voltage produced by the variable bias generator 315. For the integrated circuit device 300 of FIG. 3, the bias voltage equals the external voltage, and the magnitude of the output voltage swings of outputs Y1 and YN1 as a function of the external voltage is closely approximated by the formula: $V_{SWING}=(V_{EXT}-V_{beQ8}-V_{REF2})(R4/R8)$, where $V_{EXT}$ is the amount of the external voltage.

For the variable bias generator 405 in FIG. 4, the bias voltage as a function of the external voltage is given by the following formula: $V_{BIAS}=V_{EXT}-V_{beQ13}$.

When the variable bias generator 405 is used in the circuit 300 instead of the variable bias generator 315, the magnitude of the output voltage swings of outputs Y1 and YN1 as a function of the external voltage is closely approximated by the formula: $V_{SWING}=(V_{EXT}-V_{beQ13}-V_{beQ8}-V_{REF2})(R4/R8)$. Persons of ordinary skill in the art will be able to derive similar formulas for the circuits of FIGS. 4B and 4C.

In task 720 the amount of external voltage determined in task 715 is connected to the electrical connection area 225, to thereby produce the desired magnitude of the output voltage swings.

OTHER EMBODIMENTS AND CONCLUSION

The invention can be implemented in a variety of digital logic families, for example CML (current mode logic), ECL (emitter coupled logic), CMOS and NMOS. Although the invention has been described in terms of digital circuitry, the invention could also be used for programming the magnitude of the output voltage swings in an analog circuit or circuits.

Illustrative embodiments of the invention, including what are presently considered to be the preferred embodiments of the invention, have been described herein. It will be apparent to those skilled in the art that various changes and modifications can be made without departing from the scope of the invention as defined by the appended claims. Consequently, it is not intended that the invention should be limited to only the embodiments discussed above. Rather, the invention should be limited only by the scope of the claims.

What is claimed is:

1. An integrated circuit device adapted for optional connection to an external programming circuit, the integrated circuit device comprising:

at least one emitter coupled output section having a first output, a second output, and an emitter node;

at least one current source, each current source being connected in series with the emitter node of a respective emitter coupled output section, each current source having a respective bias voltage input for controlling the amount of current through the respective current source;

a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source;

a buffer circuit interposed between the variable bias circuit and the current source, the buffer circuit having an input connected to the output of the variable bias generator and an output connected to the bias voltage input of the current source; and an electrical connection area connected to the variable bias generator, the electrical connection area being configured for optional connection of the external programming circuit to the electrical connection area, so that when the external programming circuit is connected to the electrical connection area the bias voltage at the output of the variable bias generator is set to a value other than the default bias voltage to program the magnitude of the voltage swings at the first and second outputs of each emitter coupled output section to a magnitude other than the default magnitude.

2. The integrated circuit device of claim 1 wherein each emitter coupled output section comprises a first output transistor having an emitter and a collector, and a second output transistor having an emitter and a collector, with the emitter of the first output transistor being connected to the emitter of the second output transistor at the respective emitter node, and wherein the first output of each emitter coupled output section is connected to the collector of the first output transistor of the respective emitter coupled output section, and wherein the second output of each emitter coupled output section is connected to the collector of the second output transistor of the respective emitter coupled output section.

3. The integrated circuit device of claim 2 wherein each emitter coupled output section further comprises a first output resistor connected to the respective first output and a second output resistor connected to the respective second output.

4. The integrated circuit device of claim 3 wherein each current source comprises:

a respective current source transistor having an emitter; and a respective current source resistor connected in series with the emitter of the respective first current source transistor.

5. The integrated circuit device of claim 4 wherein each current source transistor has a base and wherein the base of each current source transistor is the bias voltage input of the respective current source.

6. The integrated circuit device of claim 5 wherein the buffer circuit further comprises a buffer input module and at least two buffer output modules, wherein the buffer input module comprises:

a first buffer resistor having an end;

a first buffer transistor having a collector, a base, and an emitter, the collector of the first buffer transistor being connected to the end of the first buffer resistor, and the base of the first buffer transistor being connected to an input to the buffer circuit; and a second buffer resistor having an end connected to the emitter of the first buffer transistor; and wherein each buffer output module comprises:

a second buffer transistor having a collector, base, and emitter, wherein the base of the second buffer transistor is connected to the collector of the first buffer transistor, a third buffer resistor having a first end connected to the emitter of the second buffer transistor;

a third buffer transistor having a collector, base, and emitter, wherein the base of the third buffer transistor is connected to the emitter of the second buffer transistor, and the emitter of the third buffer transistor is connected to a bias voltage output of the buffer output module; and a fourth buffer resistor having an end connected to the emitter of the third buffer transistor.

7. The integrated circuit device of claim 5 further comprising:

at least one emitter follower output transistor, each emitter follower output transistor having a collector, a base, and an emitter, the collector of each emitter follower output transistor being connected to a first reference voltage, the base of the first emitter follower output transistor being connected to a corresponding output of a corresponding emitter coupled output section; and at least one pad, each pad being connected to the emitter of a corresponding emitter follower output transistor.

8. The integrated circuit device of claim 5 further comprising at least one emitter follower output section, each emitter follower output section comprising an emitter follower output section transistor and an emitter follower current source that is connected in series with an emitter of the emitter follower output section transistor, wherein each emitter follower current source has an emitter follower current source bias voltage input for controlling the amount of current through the respective emitter follower current source, and wherein the bias voltage produced at the output of the variable bias generator is connected to each emitter follower current source bias voltage input.

9. The integrated circuit device of claim 5 wherein, for each emitter coupled output section, a respective first output signal is produced at the respective first output, and a respective second output signal is produced at the respective second output, and wherein the respective first output signal is the logical compliment of the respective second output signal, and wherein the magnitude of the output voftage swings of the first output and the second output of each emitter coupled output section is substantially the same as the magnitude of the output voltage swings of the first output and the second output of each other emitter coupled output section.

10. The integrated circuit device of claim 5 further comprising at least one additional circuit.

11. The integrated circuit device of claim 5 wherein the variable bias generator comprises:

a variable bias generator first resistor having a first end connected to a first voltage and a second end connected to the electrical connection area;

a variable bias generator second resistor having a first end and a second end, the first end of the variable bias generator second resistor being connected to the electrical connection area;

a variable bias generator third resistor having a first end and a second end, the first end of the variable bias generator third resistor being connected to the second end of the variable bias generator second resistor, the second end of the variable bias generator third resistor being connected to a second voltage;

a variable bias generator first transistor having a collector, a base, and an emitter, the collector of the variable bias generator first transistor being connected to the electrical connection area, the base of the variable bias generator first transistor being connected to the second end of the variable bias generator second resistor and the first end of the variable bias generator third resistor, the emitter of the variable bias generator first transistor being connected to the second reference voltage, and wherein the output of the variable bias generator is connected to the electrical connection area; and a variable bias generator capacitor having a first end connected to the electrical connection area, and a second end connected to the second reference voltage.

12. The integrated circuit device of claim 11 wherein the external programming circuit comprises a resistance.

13. The integrated circuit device of claim 11 wherein the external programming circuit comprises an external voltage source.

14. The integrated circuit device of claim 5 wherein the variable bias generator comprises:

a variable bias generator first resistor having a first end connected to a first voltage and a second end connected to the electrical connection area;

a variable bias generator second resistor having a first end and a second end, the first end of the variable bias generator second resistor being connected to the electrical connection area;

a variable bias generator third resistor having a first end and a second end, the first end of the variable bias generator third resistor being connected to the second end of the variable bias generator second resistor;

a variable bias generator first transistor having a collector, a base, and an emitter, the collector of the variable bias generator first transistor being connected to the electrical connection area, the base of the variable bias generator first transistor being connected to the second end of the variable bias generator second resistor and the first end of the variable bias generator third resistor;

a variable bias generator second transistor having a collector, a base, and an emitter, the collector and the base of the variable bias generator second transistor being connected to the emitter of the variable bias generator first transistor, the emitter of the variable bias generator second transistor being connected to a second voltage;

a variable bias generator third transistor having a collector, a base, and an emitter, the collector of the variable bias generator third transistor being connected to the first voltage, the base of the variable bias generator third transistor being connected to the electrical connection area;

a variable bias generator fourth transistor having a collector, a base, and an emitter, the collector of the variable bias generator fourth transistor being connected to the emitter of the variable bias generator third transistor, the base of the variable bias generator fourth transistor being connected to the base of the variable bias generator second transistor, the emitter of the variable bias generator fourth transistor being connected to the second reference voltage, and wherein the output of the variable bias generator is connected to the emitter of the variable bias generator third transistor; and a variable bias generator capacitor having a first end connected to the collector of the variable bias generator fourth transistor, and a second end connected to the second reference voltage.

15. The integrated circuit device of claim 14 wherein the external programming circuit comprises a resistance.

16. The integrated circuit device of claim 14 wherein the external programming circuit comprises an external voltage source.

17. The integrated circuit device of claim 5 wherein the variable bias generator comprises:

a variable bias generator first resistor having a first end connected to a first voltage and a second end connected to the electrical connection area;

a variable bias generator second resistor having a first end and a second end, the first end of the variable bias generator second resistor being connected to the electrical connection area;

a variable bias generator capacitor having a first end and a second end, the first end of the variable bias generator capacitor being connected to the second end of the variable bias generator second resistor;

a variable bias generator first transistor having a collector, a base, and an emitter, the collector of the variable bias generator first transistor being connected to the first end of the variable bias generator capacitor, the base of the variable bias generator first transistor being connected to the second end of the variable bias generator capacitor, and the emitter of the variable bias generator first transistor being connected to the second reference voltage;

a variable bias generator second transistor having a collector, a base, and an emitter, the collector of the variable bias generator second transistor being connected to the first reference voltage, and the base of the variable bias generator second transistor being connected to the electrical connection area, and the emitter of the variable bias generator second transistor being connected to the output of the variable bias generator;

a variable bias generator third resistor having a first end and a second end, the first end of the variable bias generator third resistor being connected to the emitter of the variable bias generator second transistor;

a variable bias generator third transistor having a collector, a base, and an emitter, the collector of the variable bias generator third transistor being connected to the second end of the variable bias generator third resistor and being connected to the second end of the variable bias source capacitor;

a variable bias generator fourth resistor having a first end and a second end, the first end of the variable bias generator fourth resistor being connected to the emitter of the variable bias generator third transistor, and the second end of the variable bias generator fourth resistor being connected to the second reference voltage;

a variable bias generator fifth resistor having a first end and a second end, the first end of the variable bias generator fifth resistor being connected to the emitter of the variable bias generator second transistor, the second end of the variable bias generator fifth resistor being connected to the base of the third variable bias generator transistor; and a variable bias generator diode having an anode and a cathode, the anode of the variable bias generator diode being connected to the base of the third variable bias generator transistor, the cathode of the variable bias generator diode being connected to the second reference voltage.

18. The integrated circuit device of claim 5 wherein the variable bias generator comprises:

a first variable bias generator resistor having a first end connected to the first reference voltage, and a second end connected to the electrical connection area and to the output of the variable bias generator;

a variable bias generator diode having an anode and a cathode, the anode being connected to the electrical connection area;

a variable bias generator second resistor having a first end and a second end, the first end of the variable bias generator second resistor being connected to the cathode of the variable bias generator diode, the second end of the variable bias generator second resistor being connected to the second reference voltage; and a variable bias generator capacitor having a first end and a second end, the first end of the variable bias generator capacitor being connected to the electrical connection area, the second end of the variable bias generator capacitor being connected to the second reference voltage.

19. An integrated circuit device adapted for optional connection to an external programming circuit, the integrated circuit device comprising:

at least one circuit, with at least one of the circuits comprising:

at least one emitter coupled output section having a first output, a second output, and an emitter node;

at least one current source, each current source being connected in series with the emitter node of a respective emitter coupled output section, each current source having a respective bias voltage input for controlling the amount of current through the respective current source; and a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source;

a buffer circuit interposed between the variable bias circuit and the current source, the buffer circuit having an input connected to the output of the variable bias generator and an output connected to the bias voltage input of the current source; and an electrical connection area connected to the variable bias generator, the electrical connection area being configured for optional connection of the external programming circuit to the electrical connection area, so that when the external programming circuit is connected to the electrical connection area the bias voltage at the output of the variable bias generator is set to a value other than the default bias voltage to program the magnitude of the voltage swings at the first and second outputs of each emitter coupled output section to a magnitude other than the default magnitude.

20. The integrated circuit device of claim 19 wherein each emitter coupled output section comprises a first output transistor having an emitter and a collector, and a second output transistor having an emitter and a collector, with the emitter of the first output transistor being connected to the emitter of the second output transistor at the respective emitter node, and wherein the first output of each emitter coupled output section is connected to the collector of the first output transistor of the respective emitter coupled output section, and wherein the second output of each emitter coupled output section is connected to the collector of the second output transistor of the respective emitter coupled output section.

21. The integrated circuit device of claim 20 wherein each emitter coupled output section further comprises a first output resistor connected to the respective first output and a second output resistor connected to the respective second output.

22. The integrated circuit device of claim 21 wherein each current source comprises:

a respective current source transistor having an emitter; and a respective current source resistor connected in series with the emitter of the respective first current source transistor.

23. The integrated circuit device of claim 22 wherein each current source transistor has a base and wherein the base of each current source transistor is the bias voltage input of the respective current source.

24. The integrated circuit device of claim 23 wherein the buffer circuit further comprises a buffer input module and at least two buffer output modules, wherein the buffer input module comprises:

a first buffer resistor having an end;

a first buffer transistor having a collector, a base, and an emitter, the collector of the first buffer transistor being connected to the end of the first buffer resistor, and the base of the first buffer transistor being connected to an input to the buffer circuit; and a second buffer resistor having an end connected to the emitter of the first buffer transistor; and wherein each buffer output module comprises:

a second buffer transistor having a collector, base, and emitter, wherein the base of the second buffer transistor is connected to the collector of the first buffer transistor;

a third buffer resistor having a first end connected to the emitter of the second buffer transistor;

a third buffer transistor having a collector, base, and emitter, wherein the base of the third buffer transistor is connected to the emitter of the second buffer transistor, and the emitter of the third buffer transistor is connected to a bias voltage output of the buffer output module; and a fourth buffer resistor having an end connected to the emitter of the third buffer transistor.

25. The integrated circuit device of claim 23 further comprising:

at least one emitter follower output transistor, each emitter follower output transistor having a collector, a base, and an emitter, the collector of each emitter follower output transistor being connected to a first reference voltage, the base of the first emitter follower output transistor being connected to a corresponding output of a corresponding emitter coupled output section; and at least one pad, each pad being connected to the emitter of a corresponding emitter follower output transistor.

26. The integrated circuit device of claim 23 further comprising at least one emitter follower output section, each emitter follower output section comprising an emitter follower output section transistor and an emitter follower current source that is connected in series with an emitter of the emitter follower output section transistor, wherein each emitter follower current source has an emitter follower current source bias voltage input for controlling the amount of current through the respective emitter follower current source, and wherein the bias voltage produced at the output of the variable bias generator is connected to each emitter follower current source bias voltage input.

27. The integrated circuit device of claim 23 wherein the variable bias generator comprises:

a variable bias generator first resistor having a first end connected to a first voltage and a second end connected to the electrical connection area;

a variable bias generator second resistor having a first end and a second end, the first end of the variable bias generator second resistor being connected to the electrical connection area;

a variable bias generator third resistor having a first end and a second end, the first end of the variable bias generator third resistor being connected to the second end of the variable bias generator second resistor, the second end of the variable bias generator third resistor being connected to a second voltage;

a variable bias generator first transistor having a collector, a base, and an emitter, the collector of the variable bias generator first transistor being connected to the electrical connection area, the base of the variable bias generator first transistor being connected to the second end of the variable bias generator second resistor and the first end of the variable bias generator third resistor, the emitter of the variable bias generator first transistor being connected to the second voltage, and wherein the output of the variable bias generator is connected to the electrical connection area; and a variable bias generator capacitor having a first end connected to the electrical connection area, and a second end connected to the second reference voltage.

28. The integrated circuit device of claim 23 wherein the variable bias generator comprises:

a variable bias generator first resistor having a first end connected to a first voltage and a second end connected to the electrical connection area;

a variable bias generator second resistor having a first end and a second end, the first end of the variable bias generator second resistor being connected to the electrical connection area;

a variable bias generator third resistor having a first end and a second end, the first end of the variable bias generator third resistor being connected to the second end of the variable bias generator second resistor;

a variable bias generator first transistor having a collector, a base, and an emitter, the collector of the variable bias generator first transistor being connected to the electrical connection area, the base of the variable bias generator first transistor being connected to the second end of the variable bias generator second resistor and the first end of the variable bias generator third resistor;

a variable bias generator second transistor having a collector, a base, and an emitter, the collector and the base of the variable bias generator second transistor being connected to the emitter of the variable bias generator first transistor, the emitter of the variable bias generator second transistor being connected to a second voltage;

a variable bias generator third transistor having a collector, a base, and an emitter, the collector of the variable bias generator third transistor being connected to the first voltage, the base of the variable bias generator third transistor being connected to the electrical connection area;

a variable bias generator fourth transistor having a collector, a base, and an emitter, the collector of the variable bias generator fourth transistor being connected to the emitter of the variable bias generator third transistor, the base of the variable bias generator fourth transistor being connected to the base of the variable bias generator second transistor, the emitter of the variable bias generator fourth transistor being connected to the second voltage, and wherein the output of the variable bias generator is connected to the emitter of the variable bias generator third transistor; and a variable bias generator capacitor having a first end connected to the collector of the variable bias generator fourth transistor, and a second end connected to the second reference voltage.

29. The integrated circuit device of claim 23 wherein the variable bias generator comprises:

a variable bias generator first resistor having a first end connected to a first voltage and a second end connected to the electrical connection area;

a variable bias generator second resistor having a first end and a second end, the first end of the variable bias generator second resistor being connected to the electrical connection area;

a variable bias generator capacitor having a first end and a second end, the first end of the variable bias generator capacitor being connected to the second end of the variable bias generator second resistor;

a variable bias generator first transistor having a collector, a base, and an emitter, the collector of the variable bias generator first transistor being connected to the first end of the variable bias generator capacitor, the base of the variable bias generator first transistor being connected to the second end of the variable bias generator capacitor, and the emitter of the variable bias generator first transistor being connected to the second reference voltage;

a variable bias generator second transistor having a collector, a base, and an emitter, the collector of the variable bias generator second transistor being connected to the first reference voltage, and the base of the variable bias generator second transistor being connected to the electrical connection area, and the emitter of the variable bias generator second transistor being connected to the output of the variable bias generator;

a variable bias generator third resistor having a first end and a second end, the first end of the variable bias generator third resistor being connected to the emitter of the variable bias generator second transistor;

a variable bias generator third transistor having a collector, a base, and an emitter, the collector of the variable bias generator third transistor being connected to the second end of the variable bias generator third resistor and being connected to the second end of the variable bias source capacitor;

a variable bias generator fourth resistor having a first end and a second end, the first end of the variable bias generator fourth resistor being connected to the emitter of the variable bias generator third transistor, and the second end of the variable bias generator fourth resistor being connected to the second reference voltage;

a variable bias generator fifth resistor having a first end and a second end, the first end of the variable bias generator fifth resistor being connected to the emitter of the variable bias generator second transistor, the second end of the variable bias generator fifth resistor being connected to the base of the third variable bias generator transistor; and a variable bias generator diode having an anode and a cathode, the anode of the variable bias generator diode being connected to the base of the third variable bias generator transistor, the cathode of the variable bias generator diode being connected to the second reference voltage.

30. The integrated circuit device of claim 23 wherein the variable bias generator comprises:

a first variable bias generator resistor having a first end connected to the first reference voltage, and a second end connected to the electrical connection area and to the output of the variable bias generator;

a variable bias generator diode having an anode and a cathode, the anode being connected to the electrical connection area;

a variable bias generator second resistor having a first end and a second end, the first end of the variable bias generator second resistor being connected to the cathode of the variable bias generator diode, the second end of the variable bias generator second resistor being connected to the second reference voltage; and a variable bias generator capacitor having a first end and a second end, the first end of the variable bias generator capacitor being connected to the electrical connection area, the second end of the variable bias generator capacitor being connected to the second reference voltage.

31. A method for programming the magnitude of the output voltage swings of outputs in an integrated circuit device having emitter coupled output transistors and an electrical connection area, the magnitude of the output voltage swings being a function of a reference voltage and of the amount of external resistance connected between the electrical connection area and the reference voltage, the method comprising:

ascertaining the desired magnitude of the output voltage swings;

comparing the desired magnitude of the output voltage swings to a default magnitude of the output voltage swings;

selecting a reference voltage to connect to the external resistance;

determining the amount of external resistance required to be connected between the electrical connection area and the selected reference voltage to produce the desired magnitude of the output voltage swings; and connecting the determined external resistance between the electrical connection area and the selected reference voltage to produce the desired magnitude of the output voltage swings.

32. The method of claim 31, wherein the reference voltage is selected from the group consisting of Vcc and ground.

33. A method for programming the magnitude of the output voltage swings of outputs in an integrated circuit device having emitter coupled output transistors and an electrical connection area, the magnitude of the output voltage swings being a function of the amount of the external voltage connected between the electrical connection area and a reference voltage, the method comprising:

ascertaining the desired magnitude of the output voltage swings;

comparing the desired magnitude of the output voltage swings to a default magnitude of the output voltage swings;

determining the amount of external voltage required to be connected to the electrical connection area to produce the desired magnitude of the output voltage swings; and connecting the determined external voltage to the electrical connection area to produce the desired magnitude of the output voltage swings.

34. An integrated circuit device adapted for optional connection to an external programming circuit, the integrated circuit device comprising:

at least one emitter coupled output section having a first output, a second output, and an emitter node;

at least one current source, each current source being connected in series with the emitter node of a respective emitter coupled output section, each current source having a respective bias voltage input for controlling the amount of current through the respective current source;

a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source;

an electrical connection area connected to the variable bias generator, the electrical connection area being configured for optional connection of the external programming circuit to the electrical connection area, so that when the external programming circuit is connected to the electrical connection area the bias voltage at the output of the variable bias generator is set to a value other than the default bias voltage to program the magnitude of the voltage swings at the first and second outputs of each emitter coupled output section to a magnitude other than the default magnitude; and wherein the variable bias generator comprises:
a variable bias generator first resistor having a first end connected to a first voltage and a second end connected to the electrical connection area;
a variable bias generator second resistor having a first end and a second end, the first end of the variable bias generator second resistor being connected to the electrical connection area;
a variable bias generator third resistor having a first end and a second end, the first end of the variable bias generator third resistor being connected to the second end of the variable bias generator second resistor, the second end of the variable bias generator third resistor being connected to a second voltage;
a variable bias generator first transistor having a collector, a base, and an emitter, the collector of the variable bias generator first transistor being connected to the electrical connection area, the base of the variable bias generator first transistor being connected to the second end of the variable bias generator second resistor and the first end of the variable bias generator third resistor, the emitter of the variable bias generator first transistor being connected to the second reference voltage, and wherein the output of the variable bias generator is connected to the electrical connection area; and
a variable bias generator capacitor having a first end connected to the electrical connection area, and a second end connected to the second reference voltage.

35. An integrated circuit device adapted for optional connection to an external programming circuit, the integrated circuit device comprising:
at least one circuit, with at least one of the circuits comprising:
at least one emitter coupled output section having a first output, a second output, and an emitter node;
at least one current source, each current source being connected in series with the emitter node of a respective emitter coupled output section, each current source having a respective bias voltage input for controlling the amount of current through the respective current source; and
a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source;
an electrical connection area connected to the variable bias generator, the electrical connection area being configured for optional connection of the external programming circuit to the electrical connection area, so that when the external programming circuit is connected to the electrical connection area the bias voltage at the output of the variable bias generator is set to a value other than the default bias voltage to program the magnitude of the voltage swings at the first and second outputs of each emitter coupled output section to a magnitude other than the default magnitude; and
wherein the variable bias generator comprises:
a variable bias generator first resistor having a first end connected to a first voltage and a second end connected to the electrical connection area;
a variable bias generator second resistor having a first end and a second end, the first end of the variable bias generator second resistor being connected to the electrical connection area;
a variable bias generator third resistor having a first end and a second end, the first end of the variable bias generator third resistor being connected to the second end of the variable bias generator second resistor, the second end of the variable bias generator third resistor being connected to a second voltage;
a variable bias generator first transistor having a collector, a base, and an emitter, the collector of the variable bias generator first transistor being connected to the electrical connection area, the base of the variable bias generator first transistor being connected to the second end of the variable bias generator second resistor and the first end of the variable bias generator third resistor, the emitter of the variable bias generator first transistor being connected to the second voltage, and wherein the output of the variable bias generator is connected to the electrical connection area; and
a variable bias generator capacitor having a first end connected to the electrical connection area, and a second end connected to the second reference voltage.

* * * * *